US006625768B1

(12) United States Patent
Reohr, Jr. et al.

(10) Patent No.: US 6,625,768 B1
(45) Date of Patent: Sep. 23, 2003

(54) TEST BUS ARCHITECTURE

(75) Inventors: Richard D. Reohr, Jr., Hillsboro, OR (US); Dean S. Susnow, Portland, OR (US); Brian M. Collins, Aloha, OR (US); Tom E. Burton, Vancouver, WA (US); Dominic J. Gasbarro, Forest Grove, OR (US); Brian M. Leitner, Hillsboro, OR (US); Ni Jie, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/537,398

(22) Filed: Mar. 29, 2000

(51) Int. Cl.$^7$ ............................................. G01R 31/28
(52) U.S. Cl. ........................................................ 714/729
(58) Field of Search ..................... 714/30, 724, 726, 714/727, 729, 733, 734, 738; 324/73.1; 326/16

(56) References Cited

U.S. PATENT DOCUMENTS 5,054,024 A * 10/1991 Whetsel ...................... 714/724
5,570,374 A * 10/1996 Yau et al. .................... 714/733
5,936,976 A * 8/1999 Story et al. .................. 714/724
6,081,916 A * 6/2000 Whetsel, Jr. ................ 714/727

* cited by examiner

Primary Examiner—Albert Decady
Assistant Examiner—Matthew C. Dooley
(74) Attorney, Agent, or Firm—Paul E. Steiner

(57) ABSTRACT

A test bus architecture for testing an integrated circuit having a plurality of agents includes providing both a test block select signal and test function select signal to a plurality of select decoders respectively disposed in each of the plurality of agents. The test block select signal has a number of states at least equal to the number of agents and the test function select signal at least equal to a maximum number of internal signal groups of any one of the agents, each select decoder having at least one internal signal group which is outputted from circuitry to be tested within the agent of the select decoder. An output from each of the select decoders is fed to a test bus output such that a selected internal signal group is outputted to the test bus output upon the agent of the selected signal group being selected by the state of the test block select signal and the selected signal group being selected by the state of the test function select signal by the select decoder.

31 Claims, 4 Drawing Sheets

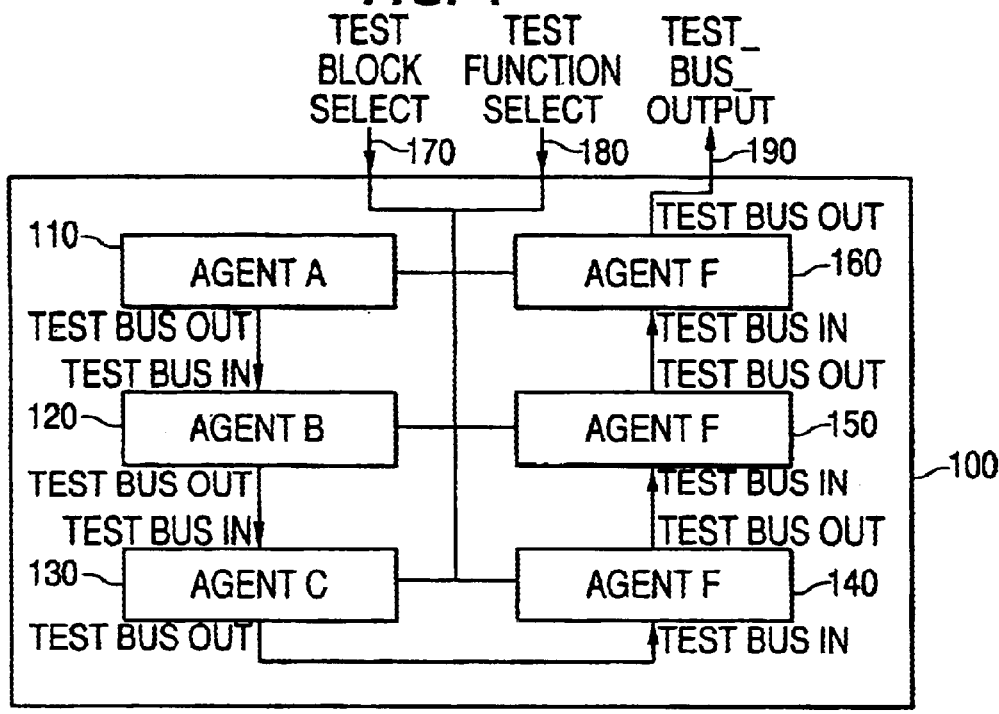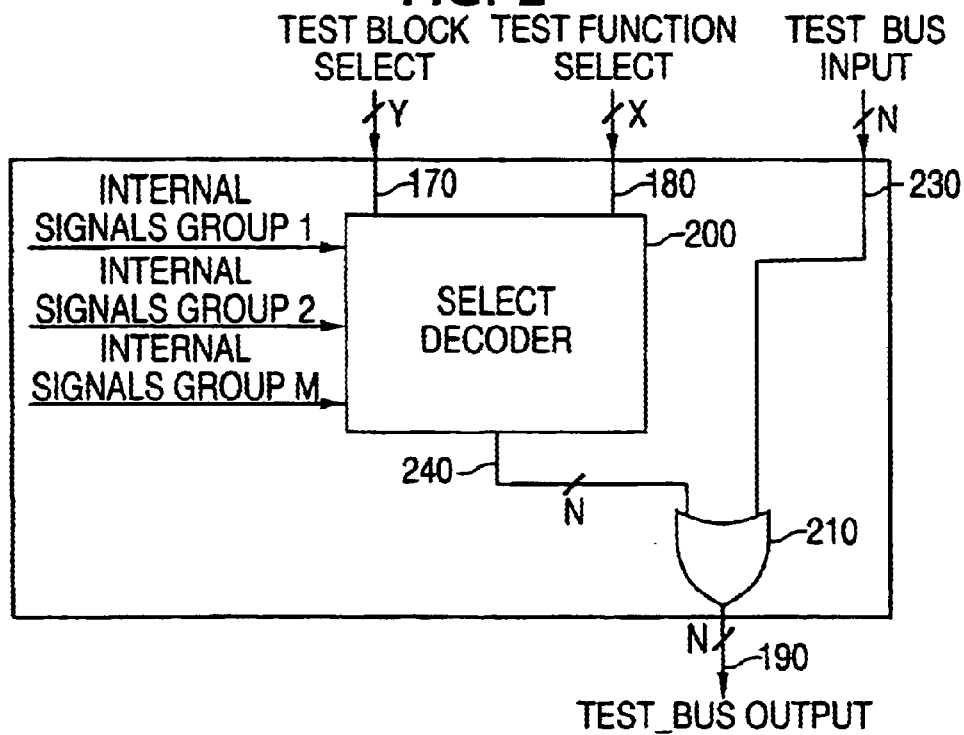

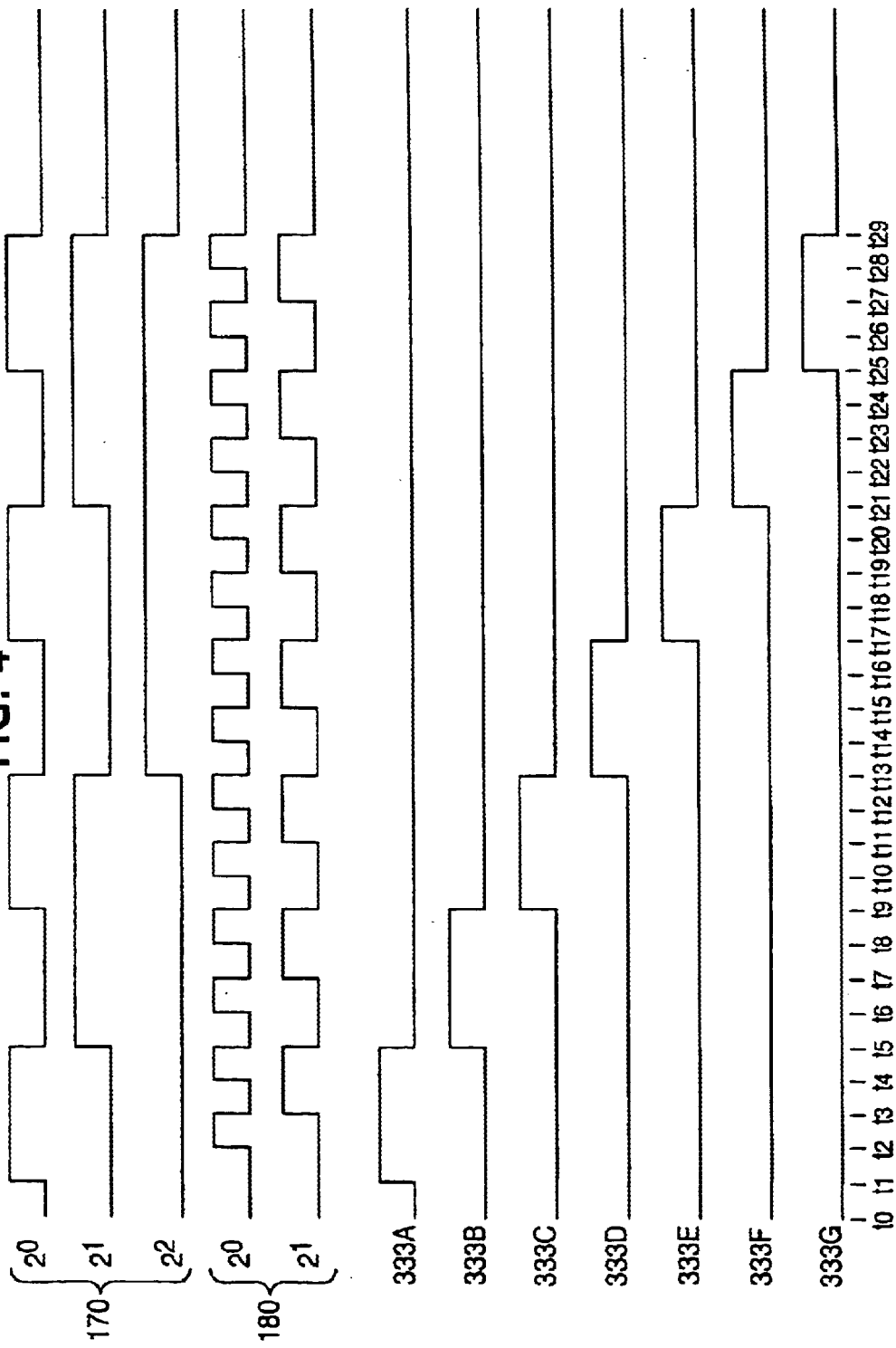

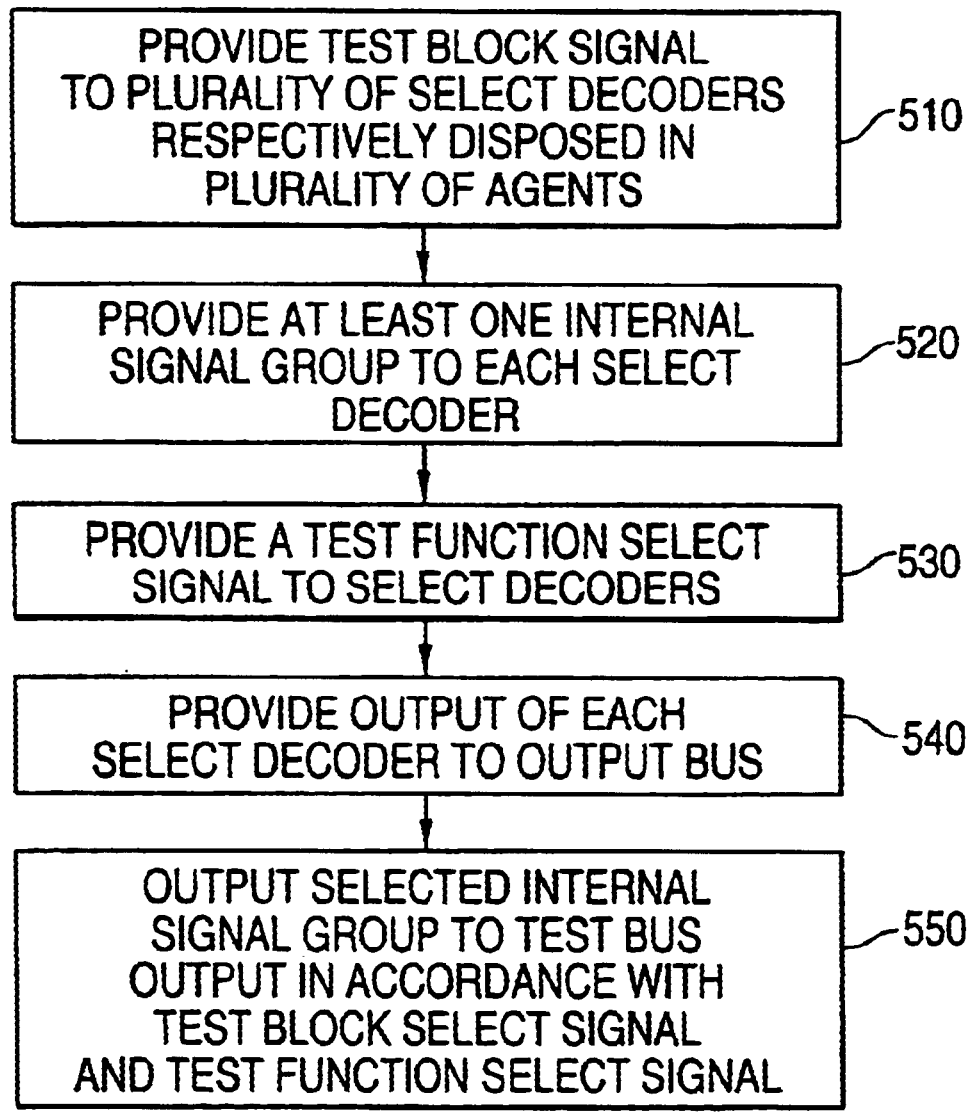

TEST BUS ARCHITECTURE

FIELD

The present invention relates to test bus architecture and more particularly to test bus architecture allowing viewing of a large number of internal signals using a small number of pins.

BACKGROUND

Integrated circuits, particularly ASICs (application specific integrated circuits), have included more and more elements in the past few years. In the past, various test points in the integrated circuits have been routed to the pins of the integrated circuit in order to facilitate testing.

However, due to the inclusion of more and more elements in integrated circuits, it has become impossible to directly connect all of the desired test points to the pins of the integrated circuits due to the limitation as to the physical number of pins available on the integrated circuit.

Accordingly, various techniques have been utilized to multiplex groups of test points so as to make them available for test purposes without requiring a separate pin for each test point. Unfortunately, the multiplexing of test points in the past has required complicated hardware arrangements on the integrated circuit which take up space on the integrated circuit and increase the cost associated with the fabrication of the integrated circuit as well as increasing its complexity.

BRIEF DESCRIPTION OF THE DRAWING

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto but rather the spirit and scope of the present invention are limited only by the terms of the appended claims.

The following represents brief descriptions of the drawings, wherein:

FIG. 1 is a block diagram of an example embodiment of the present invention.

FIG. 2 is a block diagram of an example of an agent of the example embodiment of FIG. 1.

FIG. 4 is a waveform diagram of an example embodiment of the present invention.

FIG. 5 is a flowchart of an example embodiment of the present invention.

DETAILED DESCRIPTION

Figure 3:
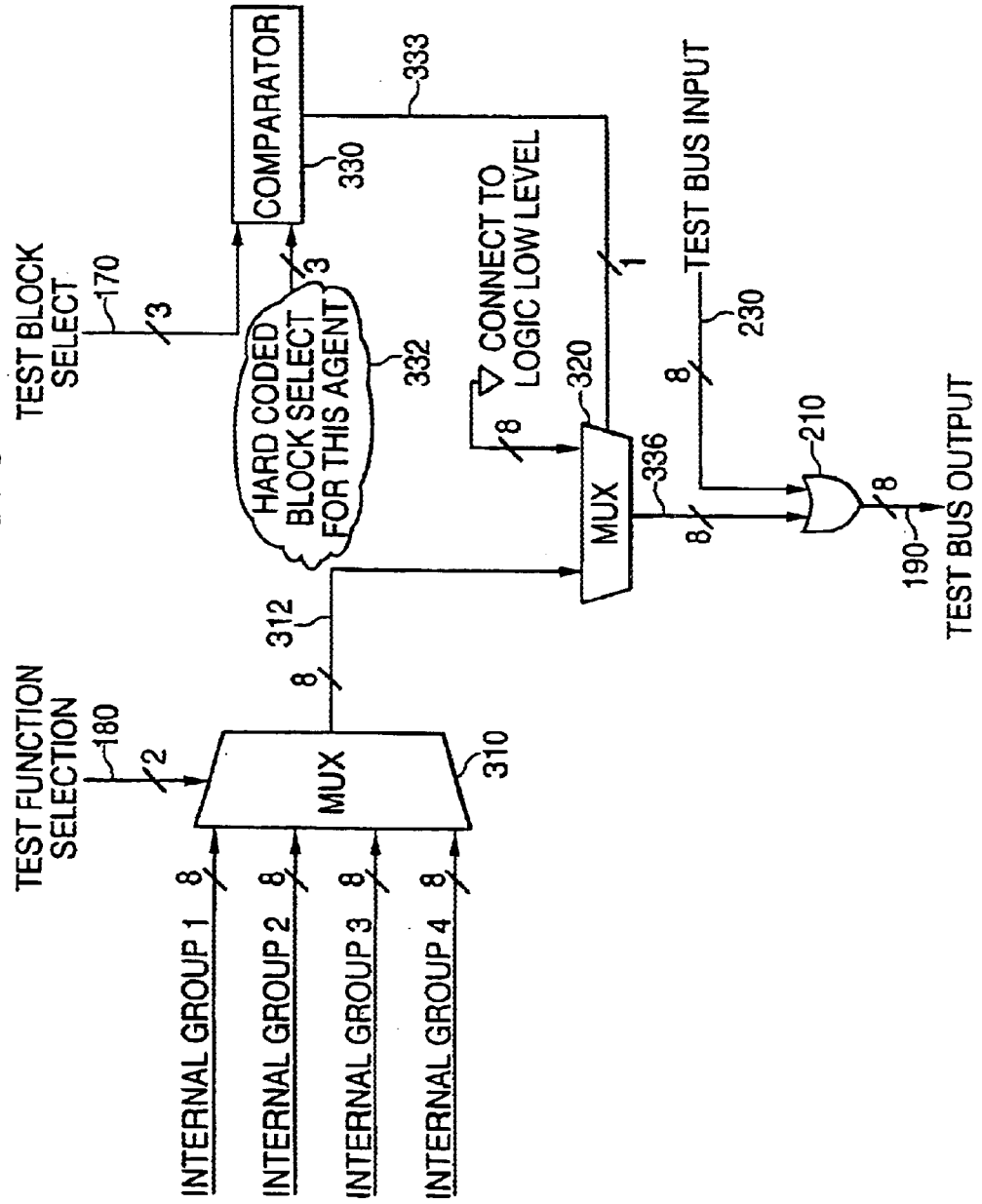
FIG. 3 is a block diagram of an example of the select decoder of FIG. 2.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Still further, the clock and timing signal FIGS. are not drawn to scale, and instead, exemplary and critical time values are mentioned when appropriate. With regard to description of any timing signals, the terms "assertion" and "negation" may be used in an intended generic sense. More particularly, such terms are used to avoid confusion when working with a mixture of "active-low" and "active-high" signals, and to represent the fact that the invention is not limited to the illustrated/described signals, but could be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, well known power connections to ICs and other components may not be shown within the FIGS. for simplicity of illustration and discussion, and so as not to obscure the invention.

The test bus architecture in accordance with the present invention allows the testing of an integrated circuit having a number of agents contained therein. A test block select signal and a test function select signal are provided to select decoders respectively disposed in each of the agents. Each select decoder has at least one internal signal group which is outputted from circuitry to be tested within the agent of the select decoder. An output from each select decoder is fed to a test bus output such that a selected internal signal group is outputted to the test bus output when the agent of the selected signal group is selected by the test block select signal and the selected signal group is selected by the test function select signal.

FIG. 1 is a block diagram of an example test bus architecture in accordance with the present invention. Integrated circuit 100 is illustrated as containing agent A 110, agent B 120, agent C 130, agent D 140, agent E 150, and agent F 160. These agents taken together form the entire integrated circuit structure including the operational circuits of the integrated circuit 100 as well as the test bus architecture and test bus logic required for the integrated circuit. A test block select input 170 and test function select input 180 are connected to all of the agents. The test bus output 190 is connected to agent F 160. It is to be understood that the various interconnections of the operational lines between the agents have not been illustrated for the sake of simplicity, but rather only the test bus lines between agents have been illustrated. In addition, while the test bus output 190 and test block select 170 and test function select input 180 have been illustrated as single lines, it is to be understood that they represent multiple lines, the number of which depending upon the specific needs of the agents of the integrated circuit, as will be discussed below As illustrated in FIG. 1, a test block select input 170 and test function select input 180 are inputted to all of the agents. The test block select input 170 determines which agent is to be selected for testing purposes. In the present example of FIG. 1, since there are six agents, the test block select line may comprise three lines. The use of three lines for the test block select input 170 allows for seven agents since one state of the three lines, normally all logic low levels, is reserved for the condition that no agent has been selected. As illustrated in Table 1 below, if three lines are used for the test block select input 170, it may assume a total of eight different states. Since there is no agent G in the example integrated circuit 100 of FIG. 1, the agent G selection in Table 1 below would, in fact, correspond to no agent selected.

TABLE 1

| Test Block Select Lines | Agent Selected |
| --- | --- |
| 000 | No Agent Selected |
| 001 | Agent A |
| 010 | Agent B |
| 011 | Agent C |
| 100 | Agent D |
| 101 | Agent E |
| 110 | Agent F |
| 111 | Agent G |

In a similar fashion, the state in which the first and second test block select lines are at logic low levels and the third test block select line is at a high logic level, may, for example, correspond to the state in which agent A has been selected.

Four test block select lines allow for fifteen agents and five test block select lines allow for thirty-one agents, etc.

The number of actual lines of the test function select input 180 is dependent upon the maximum of number of test functions needed by any agent to which the test function select input 180 is connected to. That is, two lines would be needed for up to four test functions unless one logic state for the two lines is reserved for no test function being selected, and if, for example, one agent required 12 different test functions, then the test function select input 180 would comprise four lines. Note that the test circuitry in a particular agent is not required to have the same number of test functions as that of another agent. Accordingly, agents A–F may all have different numbers of test functions with the number of lines for the test function select input 180 being determined by the maximum number of test functions of any one agent.

The test bus output input 190 may comprise a plurality of lines whose number is determined by the maximum number of test outputs of any of the agents connected to the test bus output 190. Since the test bus output 190 has its lines connected to output pins of the integrated circuit 100, there may also be a limitation with regard to the number of lines of the test bus output 190 based on the maximum number of pins available for test purposes. Similarly, the lines of the test block select input 170 and the test function select input 180 may also connected to pins of the integrated circuit 100 such that in actuality, there must be a tradeoff between the number of agents that the integrated circuit is divided into and number of test functions for each agent and number of lines of the test bus output available to a user. It is to be noted that in some applications, the lines of the test block select input 170 and the test function select input 180 may be connected to a programmable register internal to the integrated circuit 100 which is accessed via the pins of the integrated circuit 100 associated with non-test functionality. Nevertheless, the total number of lines is still limited. That is, the total number of test functions and test bus outputs needed for the integrated circuit 100 and the number of pins available for the test function select and test block select inputs 170 and test bus output 190 will determine the number and size of the agents that the integrated circuit 100 is split into for the purpose of testing.

All of the agents, except agent A, has a test bus output and a test bus input. The test bus output of agent A, which as noted above, may contain several lines, is inputted to the test bus input of agent B and the test bus output of agent B is inputted to the test bus input of agent C, etc. The test bus inputs and outputs may be daisy-chained such that, as will be explained below, only an agent selected by the test block select input 170 provides an output to the test bus output 190 in accordance with the test function select input 180.

FIG. 2 illustrates an example of the test logic architecture of one example agent of FIG. 1, again noting that the actual operating circuitry contained within the agent has not been shown for the purpose of simplicity. The agent, labeled 250 in FIG. 2, includes a select decoder 200 and an OR gate 210.

The test block select input 170 and test function select input 180 correspond to those of FIG. 1 and the test bus output 190 corresponds to the test bus output 190 of FIG. 1 in the case of agent F. The test bus input 230 correspond to the test bus input of each agent of FIG. 1, again noting that agent A does not have a test bus input line or OR gate 210 since it is the first agent in the daisy-chain of agents.

In the example shown in FIG. 2, there are Y test block select lines 170 and X test function select lines 180 and N test bus input lines 230 and N test bus output lines 190.

The select decoder 200 is illustrated as having M internal signal groups 1–M inputted thereto. The OR gate 210 is illustrated as a single gate but in fact comprises N gates each having one input connected to one of the N inputs of the test bus input 230 and having another input connected to one of N outputs 240 from the select decoder 200. Each OR gate of the OR gates 210 has a single output connected to one of N test bus output line 190.

Referring to FIG. 3, which illustrates an example select decoder according to an example embodiment, in one example of the select decoder 200, Y is equal to 3, X is equal to 2, and N is equal to 8.

Accordingly, there are two function select input lines 180 which are inputted to a multiplexer 310 which multiplexes eight respective lines from internal groups 1, 2, 3, and 4 into a single set of eight lines 312. The three lines of the test block select lines 170 are inputted to a comparator 330 which has another three input lines 332 which are hard coded for the block select for this particular agent. Upon the test block select input lines 170 having a logic value equal to that of the hard coded block select input lines for this agent 332, the comparator 330 produces a predetermined output 333 which is inputted to a second multiplexer 320. If this predetermined output 333 is a logic high level, for example, then the comparator 330 produces a logic low level for all other values of the test block select.

The multiplexer 320 has eight inputs connected to the output 312 of the multiplexer 310 and has eight alternate inputs connected to a logic low level. Thus, the output of the multiplexer 320 are eight lines 336 which either assume the value of the output 312 of the multiplexer 310 or produce a logic low level on all of the eight output lines 336.

The test bus input 230 consists of eight lines which are fed to eight OR gates 210 (only one OR gate is shown for the purpose of simplicity) which also receives the eight output lines 336 from the multiplexer 320. The output of the eight OR gates 210 form the eight output lines of the test bus output 190. Note that the OR gate 210 of FIG. 2 is the same as the OR gate 210 of FIG. 3 and the lines 336 of FIG. 3 are, in fact, the same as lines 240 of FIG. 2.

The select decoder 200 is arranged such that if that particular agent has not been selected, the output lines 336 of the multiplexer 320 would all be at a logic low level so that the test bus input 230 and the test bus output 190 would assume the same value. This allows all of the agents shown in FIG. 1 to be daisy chained with regard to the test bus outputs and inputs with the exception of agent A. Agent A being the first agent in the daisy chain, has no test bus input and does not need the OR gate 210. Instead, the outputs 336 of the multiplexer 320 of Agent A is directly connected to the test bus output 190.

Referring to FIGS. 1–3 and proceeding to an example where the agents A–F are sequentially selected, initially, the test block select input lines 170 are arranged to select agent A, for example. Then, the test function select lines 180 are changed sequentially, for example, to select the internal signals groups 1–M of agent A. The outputs of the selected signals groups are respectively output on the test bus output lines 190. These signals groups consist of the signals internal to the integrated circuit 100 which are to be accessed so as to test the internal circuitry of the integrated circuit 100.

After all of the groups of agent A have been selected, the test block select input lines 170 are changed so as to select agent B and the process is repeated so as to select all of the internal groups of agent B.

The process is then repeated for agents C, D, E and F so as to sequentially check all of the internal groups of all of the agents so as to thereby test all of the internal test points of the entire integrated circuit 100.

In more detail, referring to FIG. 4, at time $T_o$, the three lines of the test block select 170 are all at a low logic level and no agent has been selected. This is illustrated by the last seven waveforms of FIG. 4 in which 333A is the output 333 of the comparator 330 of agent A and waveform 333B is the output 333 of the comparator 330 of agent B, etc.

At time $T_1$, the lowest order line of the test block select 170 is changed to a high logic level. Assuming that the hard coded block select for agent A is 001, then agent A is selected at time $T_1$. This is illustrated in FIG. 4 by waveform 333A going to a high logic level.

Then, at time $T_o$ and $T_1$, the test function select lines 180 are both at a low logic level. Accordingly, between time $T_1$ and $T_2$, internal group 1 of agent A is selected by the multiplexer 310 of agent A such that the output 312 of the multiplexer 310 corresponds to the test points of internal group 1 of agent A which are connected to the multiplexer 310. The output 333 A, being a high logic level between time points $T_1$ and $T_5$, causes the multiplexer 320 of agent A to pass the output 312 of multiplexer 310 directly to the logic OR gate 210 of agent A.

Since the outputs 333 of the comparators 330 of the remaining agents are all at a low logic level between time $T_1$ and $T_5$, the multiplexers 320 of the remaining agents connect a hardwired low logic level to the output 336 of their respective multiplexers such that the daisy chained test bus inputs output the test bus output of agent A to the test bus output 190 of the integrated circuit 100.

Thus, as illustrated in FIG. 4, the outputs of internal groups 1, 2, 3 and 4 of agent A are respectively output from the test bus output 190 during time periods $T_1$–$T_2$, $T_2$–$T_3$, $T_3$–$T_4$ and $T_4$–$T_5$.

At time $T_5$, the lines of test block select 170 change value such that another agent, for example, agent B, is selected. As illustrated in FIG. 4, the output 333B of the comparator 330 of agent B, for example, is changed to a logic high level and remains so until time $T_9$. The lines of the test function select 180 vary as shown in FIG. 4 such that the outputs of internal groups 1, 2, 3 and 4 of test agent B, for example, are transferred by the multiplexer 310 and 320 of agent B and the OR gate 210 to the test bus output 190 during respective time periods $T_5$–$T_6$, $T_6$–$T_7$, $T_7$–$T_8$ and $T_8$–$T_9$.

In a similar fashion, the internal groups 1–4 of agents C, D, E, F and G, for example, are outputted from the test bus output 190 during time periods $T_9$–$T_{13}$, $T_{13}$–$T_{17}$, $T_{17}$–$T_{21}$, $T_{21}$–$T_{25}$ and $T_{25}T_{29}$. In this way, all of the internal groups (of test points) of all of the agents of the integrated circuit 100 may be accessed for testing purposes. Note that FIG. 4 assumes that there is an agent G. In the example integrated circuit 100 of FIG. 1, no agent G is present.

While during a normal test procedure, all of the internal groups of all of the agents may be tested sequentially, they of course may be selected randomly or in some other predetermined order or in fact a single internal group of a single one of the agents may be selected for specific testing purposes.

Referring to FIGS. 1 and 2 again, one can generalize that the maximum total number of agents is equal to $2^Y-1$, wherein Y is equal to the number of test block select lines 170. The maximum number of internal signal groups M is equal to $2^X$, where X is the number of test function select lines 180. The number of lines of the test bus output N must be made equal to the greatest number of lines of any one internal signal group.

The total number of internal test points which may be accessed is therefore equal to the number of internal signal groups multiplied by the number of agents multiplied by the number of lines of the test bus output. That is, the maximum total number of internal test points is equal to $2^X.(2^Y-1).N$. However, there are other constraints which must be considered in determining the configuration of the test bus architecture. That is, the number of pins available for testing may determine the number of lines of the test bus output and test block select and test function select lines. Furthermore, the physical arrangement of the integrated circuit may be a determinative factor in the number of agents and number of internal signal groups of each agent.

FIG. 5 is a flowchart of the operation of an example embodiment of the present invention. Note that while the blocks are shown in sequential order, it is merely for exemplary purposes and the functions noted in the blocks may occur either simultaneously or in an order other than that shown in FIG. 5.

In the block 510, a test block select signal 170 is provided to a plurality of select decoders 200 respectively disposed in a plurality of agents 110, 120, 130, 140, 150, and 160. In block 520, at least one internal signal group is provided to each select decoder 200 and in block 530, a test function select signal 180 is provided to the select decoders 200. In box 540, an output of each select decoder 200 is provided to the output bus 190. In box 550, a selected internal signal group is output to the test bus output 190 in accordance with the test block select signal 170 and the test function select signal 180.

The test bus architecture of the present invention is easily expandable and easily implemented with a low gate count, thereby decreasing the per unit cost thereof.

The test bus architecture of the present invention can be expanded for any number of agents or functions within an agent by simply increasing the number of test select lines. Each agent can add signals as needed, once the test bus has been connected to an agent and this allows the signals to be added and deleted within an agent without effecting other agents on the bus, thereby giving complete control to each agent owner on what and when functions are added.

The test bus is easy to implement because of the modular approach and one common bus. Agents can be added or deleted as the integrated circuit chip is developed. The top-level hierarchy could connect all agents together, making it easy to manage. Having the agents control the signals going on to the bus keeps the routing of the bus localized. That is, instead of having many signals routed through the chip, only the test bus gets routed. As an example, an integrated circuit chip that has a 12 bit bus that goes through ten agents may have up to sixteen 12 bit busses internal to each agent. Without the test bus, the same visibility would have required 12–160:1 multiplexers at the top level to get all of the signals out of the chip and this would be difficult to route and would require major rework every time internal nodes were added or deleted.

With this architecture, the test bus can be hooked up to all of the major blocks at the start of a project and this allows the synthesis and timing analysis scripts to be developed early with this major test feature already included. The signals that are hooked up internally to each agent can be added any time after the test bus is connected without effecting the structure of the integrated circuit chip. This is a major savings in time in that it is very time consuming for both synthesis and timing analysis to have the chip hierarchy or pinouts of blocks of hierarchies change. Schedules are impacted due to the additional debug logic because normally it is done at the tail of the development of an integrated circuit chip and the present invention solves that problem.

The present invention allows for a low gate count while allowing a high degree of visibility using a simple multiplexing structure and a shared bus to reduce the complexity of control logic needed to source and select a large number of internal signals, thereby resulting in reduced die area for test logic and thereby lowering the per unit cost.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method of testing an integrated circuit comprising a plurality of agents, the method comprising:

providing a test block select signal to a plurality of select decoders respectively disposed in each of said plurality of agents;

providing at least one internal signal group to each select decoder, said at least one internal signal group being outputted from circuitry to be tested within the agent of said select decoder;

providing a test function select signal to said select decoders of said plurality of agents; and providing an output from each of said select decoders to a test bus output;

wherein a selected internal signal group is outputted to said test bus output upon the agent of said selected signal group being selected in accordance with said test block select signal and the selected signal group being selected in accordance with said test function select signal by the select decoder.

2. The method of claim 1, wherein said test block select signal has a number of states equal to at least one or more than the number of agents, said agent being selected in accordance with the state of said test block select signal.

3. The method of claim 2, further comprising providing a plurality of signal lines sufficient to represent the number of states for the test block select signal in binary form.

4. The method of claim 1, wherein said test function select signal has a number of states at least equal to a maximum number of internal signal groups of any one of said plurality of agents, said selected signal group being selected in accordance with the state of said test function select signal.

5. The method of claim 4, further comprising providing a plurality of signal lines sufficient to represent the number of states for the test function select signal in binary form.

6. The method of claim 1, wherein each of said at least one internal signal group of each select decoder is selected sequentially to be outputted to said test bus output.

7. The method of claim 1, wherein each of said at least one internal signal group of each select decoder is selected in a predetermined order to be outputted to said test bus output.

8. The method of claim 1, wherein the test bus originates internally to one of the plurality of agents.

9. The method of claim 1, wherein the test block select signal is provided simultaneously with the test function select signal.

10. An apparatus for testing an integrated circuit comprising a plurality of agents, the apparatus comprising:

a select decoder disposed in each of the plurality of agents;

a test block select signal generator for providing a test block select signal to said plurality of select decoders;

each of said select decoders being connected to at least one internal signal group of its respective agent, said at least one internal signal group being outputted from circuitry to be tested within the agent of said select decoders;

a test function select signal generator for providing a test function select signal to said decoders of said plurality of agents; and an output circuit for providing an output from each of said select decoders to a test bus output;

wherein a selected internal signal group is outputted to said test bus output upon the agent of said selected signal group being selected in accordance with said test block select signal and the selected signal group being selected in accordance with said test function select signal by the select decoder.

11. The apparatus of claim 10, wherein said test block select signal has a number of states equal to at least one or more than the number of agents, said agent being selected in accordance with the state of said test block select signal.

12. The apparatus of claim 11, wherein the test block signal comprises a plurality of signal lines sufficient to represent the number of states for the test block select signal in binary form.

13. The apparatus of claim 10, wherein said test function select signal has a number of states at least equal to a maximum number of internal signal groups of any one of said plurality of agents, said selected signal group being selected in accordance with the state of said test function select signal.

14. The apparatus of claim 13, wherein the test function signal comprises a plurality of signal lines sufficient to represent the number of states for the test function select signal in binary form.

15. The apparatus of claim 10, wherein said output circuit comprises at least one OR gate.

16. The apparatus of claim 10, wherein said select decoder comprises:
- a first multiplexer having inputs to receive internal signal groups from each of the internal signals of the agent of said select decoder and providing an output corresponding to one of said internal signal groups in accordance with said test function select signal, said test function select signal being inputted to said first multiplexer;
- a second multiplexer having a first input connected to said output of said first multiplexer and having a second input connected to a logic 0 level and for selectively outputting one of said first and second inputs in response to a control signal input thereto;
- a comparator having an input connected to said test block select signal and having a predetermined signal inputted to another input of said comparator, said comparator having an output connected to said control input of said second multiplexer, said output of said comparator assuming a predetermined value upon the signals inputted thereto being identical; and
- an OR gate having an input connected to an output of said second multiplexer and having another input connected to a test bus output of another of said agents and having an output connected to said test bus output.

17. The apparatus of claim 10, wherein each of said at least one internal signal group of each select decoder is selected sequentially to be outputted to said test bus output.

18. The apparatus of claim 10, wherein each of said at least one internal signal group of each select decoder is selected in a predetermined order to be outputted to said test bus output.

19. The apparatus of claim 10, wherein the test bus originates internally to one of the plurality of agents.

20. The apparatus of claim 10, wherein the test block select signal is provided simultaneously with the test function select signal.

21. An integrated circuit apparatus comprising:
- a plurality of agents;
- a select decoder disposed in each of the plurality of agents;
- a test block select signal generator for providing a test block select signal to said plurality of select decoders;
- each of said select decoders being connected to at least one internal signal group of its respective agent, said at least one internal signal group being outputted from circuitry to be tested within the agent of said select decoders;
- a test function select signal generator for providing a test function select signal to said decoders of said plurality of agents;
- an output circuit for providing an output from each of said select decoders to a test bus output;
- wherein as selected internal signal group is outputted to said test bus output upon the agent of said selected signal group being selected in accordance with said test block select signal and the selected signal group being selected in accordance with said test function select signal by the select decoder.

22. The apparatus of claim 21, wherein said test block select signal has a number of states equal to at least one or more than the number of agents, said agent being selected in accordance with the state of said test block select signal.

23. The apparatus of claim 22, wherein the test block signal comprises a plurality of signal lines sufficient to represent the number of states for the test block select signal in binary form.

24. The apparatus of claim 21, wherein said test function select signal has a number of states at least equal to a maximum number of internal signal groups of any one of said plurality of agents, said selected signal group being selected in accordance with the state of said test function select signal.

25. The apparatus of claim 24, wherein the test function signal comprises a plurality of signal lines sufficient to represent the number of states for the test function select signal in binary form.

26. The apparatus of claim 21, wherein said output circuit comprises at least one OR gate.

27. The apparatus of claim 21, wherein said select decoder comprises:
- a first multiplexer having inputs to receive internal signal groups from each of the internal signals of the agent of said select decoder and providing an output corresponding to one of said internal signal groups in accordance with said test function select signal, said test function select signal being inputted to said first multiplexer;
- a second multiplexer having a first input connected to said output of said first multiplexer and having a second input connected to a logic 0 level and for selectively outputting one of said first and second inputs in response to a control signal input thereto;
- a comparator having an input connected to said test block select signal and having a predetermined signal inputted to another input of said comparator, said comparator having an output connected to said control input of said second multiplexer, said output of said comparator assuming a predetermined value upon the signals inputted thereto being identical; and
- an OR gate having an input connected to an output of said second multiplexer and having another input connected to a test bus output of another of said agents and having an output connected to said test bus output.

28. The apparatus of claim 21, wherein each of said at least one internal signal group of each select decoder is selected sequentially to be outputted to said test bus output.

29. The apparatus of claim 21, wherein each of said at least one internal signal group of each select decoder is selected in a predetermined order to be outputted to said test bus output.

30. The apparatus of claim 21, wherein the test bus originates internally to one of the plurality of agents.

31. The apparatus of claim 21, wherein the test block select signal is provided simultaneously with the test function select signal.

* * * * *